United States Patent [19]

Mead et al.

[11] 4,042,887
[45] Aug. 16, 1977

[54] BROAD BAND AMPLIFIER

[75] Inventors: Hansel B. Mead, Melbourne; Gary R. Callaway, Indian Harbor Beach, both of Fla.

[73] Assignee: Q-Bit Corporation, Melbourne, Fla.

[21] Appl. No.: 668,574

[22] Filed: Mar. 19, 1976

Related U.S. Application Data

[63] Continuation of Ser. No. 524,759, Nov. 18, 1974, abandoned.

[51] Int. Cl.$^2$ ............................................. H03F 3/60
[52] U.S. Cl. ...................................... 330/53; 330/28; 330/31; 333/10
[58] Field of Search .................. 330/21, 28, 31, 53, 330/56; 333/10

[56] References Cited

U.S. PATENT DOCUMENTS

| 3,371,284 | 2/1968 | Englebrecht | 333/10 X |
| 3,624,536 | 11/1971 | Norton | 330/53 |

FOREIGN PATENT DOCUMENTS

| 1,934,103 | 1/1971 | Germany | 330/28 X |

Primary Examiner—Lawrence J. Dahl
Attorney, Agent, or Firm—LeBlanc & Shur

[57] ABSTRACT

Disclosed is a broad band amplifier for use as a preamplifier in TV receiving systems and in other applications where broad band amplification is desired. A ferrite directional coupler is used to negatively feed back a portion of the output of an amplifying stage to its input.

9 Claims, 13 Drawing Figures

BROAD BAND AMPLIFIER

This is a continuation of application Ser. No. 524,759, filed Nov. 18, 1974, now abandoned.

This invention is directed to an amplifier usable over a very wide frequency band including the VHF and UHF broadcast bands and more particularly, is directed to a broad band transistor amplifier using a ferrite directional coupler for negative feedback to increase the bandwidth.

In conventional broadband amplifier circuits used in VHF, UHF and other wide band RF applications, it is customary to use an NPN junction transistor connected in a common emitter circuit. In the conventional broadband amplifier stage, the transistor gain and input impedance are a function of frequency. The gain and input impedance usually decrease with increasing frequency. In an effort to achieve flat broadband gain and impedance match, usually both emitter degeneration and collector feedback are used. At low frequency, where the transistor gain is high, negative feedback is achieved by emitter resistance and collector feedback. This controls the gain and input-output impedance circuit. At higher frequencies, near the maximum frequency, collector feedback is reduced and while the transistor gain is low, the circuit gain increases. By proper selection of components, a broadband amplifier can be achieved. However, under these circumstances, the noise figure is poor and does not approach what may be achieved over a narrow RF bandwidth with no feedback.

In the present invention, a significantly improved broadband amplifier is obtained through the use of a broadband directional coupler supplying negative feedback to the amplifying transistor. The broadband directional coupler has an operating bandwidth of at least 2 decades and preferably much more. This is achieved through the use of a ferrite directional coupler coupling negative feedback energy between the input and output sides of an RF transistor stage in a simplified, inexpensive and novel manner. A flat gain over wide RF bandwidth is obtained along with good input/output impedance match over the entire bandwidth and noise figures as good as can be realized in narrow band circuits. Because of negative feedback, intermodulation distortion is lower and good unilateral properties are realizable even with one-stage amplifiers.

It is therefore one object of the present invention to provide an improved broadband RF amplifier.

Another object of the present invention is to provide a broadband transistor amplifier using a broadband directional coupler for negative feedback.

Another object of the present invention is to provide a broadband transistor amplifier utilizing a ferrite hybrid directional coupler for negative feedback.

Another object of the present invention is to provide an amplifier having flat gain over wide RF bandwidths, good impedance match, low intermodulation distortion and good unilateral properties for use at RF frequencies.

These and further objects and advantages of the invention will be more apparent upon reference to the following specification, claims, and appended drawings, wherein:

Figure 1:
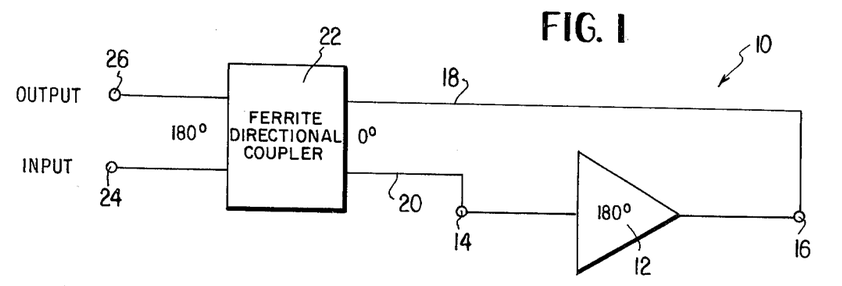
FIG. 1 is a simplified block diagram of a broadband amplifier constructed in accordance with the present invention and utilizing a broadband directional coupler for negative feedback.

Referring to the drawings, the novel broadband amplifier of the present invention is generally indicated at 10 in FIG. 1. The amplifier stage 10 of FIG. 1 comprises a transistor amplifier 12 shown as having a 180° phase shift between its input 14 and its output 16. Connected between the input 14 and the output 16 by way of a pair of leads 18 and 20, is a broadband directional coupler 22. An input signal is applied to the amplifier stage 10 in FIG. 1 between an input terminal 24 and ground, and an output signal is derived from the amplifier stage 10 between an output terminal 26 and ground. Broadband directional coupler 22 is shown as having a 180° phase shift between terminals 24 and 26 and a 0° phase shift between leads 18 and 20.

Figure 2:
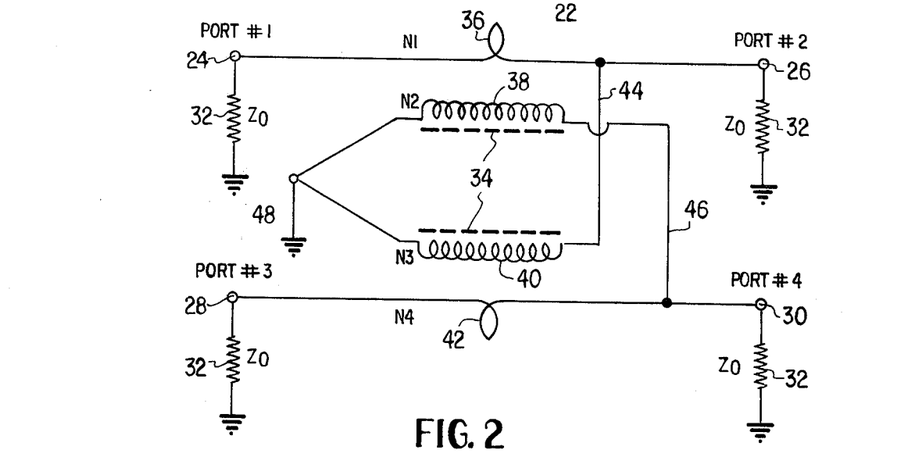
FIG. 2 is an electrical circuit diagram of the directional coupler used in the amplifier of FIG. 1.

FIG. 2 is an electrical circuit diagram of the directional coupler 22 of FIG. 1. The directional coupler is a four-port device comprising ports 24 and 26 labeled ports 1 and 3, respectively, and ports 18 and 20 labeled ports 3 and 4 respectively. Each port is terminated in a characteristic impedance 32 labeled $Z_0$. It is provided with a ferrite core identified by the dashed lines 34 and includes four windings 36, 38, 40 and 42 labeled N1, N2, N3, and N4, respectively. Winding 40 is connected to port No. 2 by way of a lead 44 and similarly winding 38 is connected to port No. 4 by way of a lead 46. The outer windings are connected to ground as at 48.

In the directional coupler 22 of FIG. 2, a signal fed into port No. 1 is divided between port No. 2 and the decoupled port No. 3. At the decoupled port, the signal is down anywhere from approximately 7db through 20db, depending upon the parameters of the device. By way of example only, the signal at decoupled port 3 may be down 12db. Port 4 in this case is the isolated port at which no signal appears. The turns of winding 36 equals the turns of winding 42, and the turns of winding 38 equals the turns of winding 40, i.e., N1 = N4 and N2 = N3. The turns ratio between N1 and N2 controls the coupling coefficient.

When a feed signal is applied to port 1, the decoupled port 3 signal is 180° out of phase. If port 2 is fed, the signal is divided between port 1 and decoupled port 4 with port 3 being the isolated port. In this case, the decoupled signal from port 4 is in the same phase (0°) with respect to the input signal at port 2.

Figure 3:
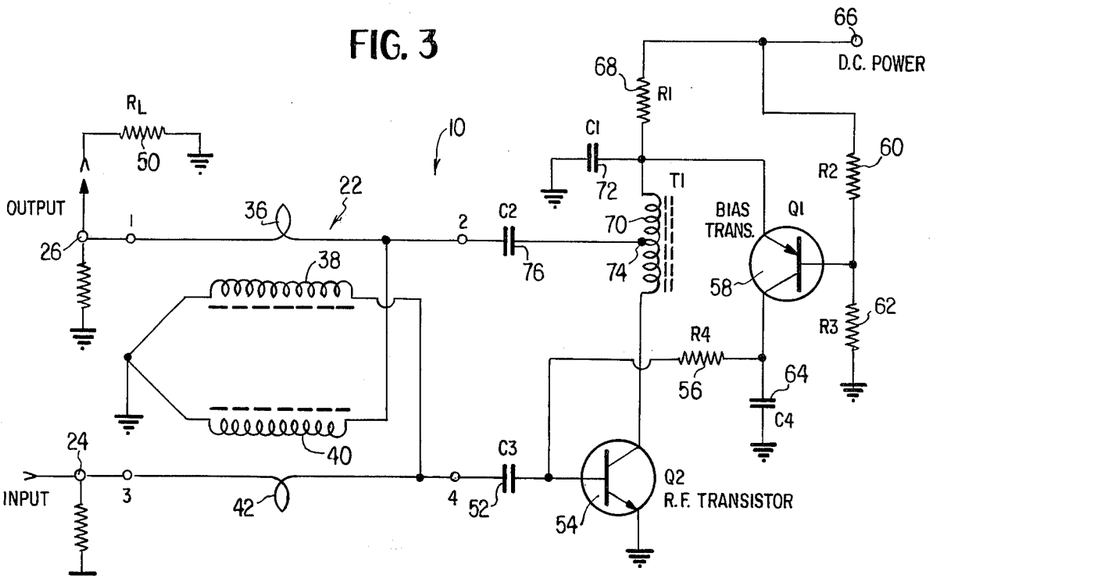
FIG. 3 is a more detailed circuit diagram of a single-stage broadband amplifier constructed in accordance with the block diagram of FIG. 1.

FIG. 3 is a more detailed circuit diagram of the broadband amplifier 10 of FIG. 1. The input signal is applied to the directional coupler 22 in which the ports are identified in the same sequence as in FIG. 2. As shown, the input signal at terminal 24 is applied to port 3 of the directional coupler and the output signal at terminal 26 is taken from port 1 of directional coupler 22. The output signal is taken from terminal 26 and applied to a load resistor 50 labeled $R_L$.

The input signal is coupled through winding 42 and a capacitor 52 labeled C3 to the base of an NPN junction transistor 54 labeled Q2 which forms the RF amplifying transistor for amplifying stage 10. The base of this transistor is connected through a resistor 56 to the emitter of a PNP junction transistor 58 labeled Q1, which is a bias transistor and forms a part of the bias circuit for RF amplifying transistor 54. DC power for the amplifier is supplied at point 66. The DC connector current for RF transistor 54 flows through resistor 68 and RF step down transformer 70. Base current for RF transistor 54 flow through bias transistor 58 and resistor 56. Collector voltage and current is adjusted by the reference voltage at the base of bias transistor 58 which is determined by the values of resistors 60 and 62. DC current and voltage is thereby regulated by this biasing scheme. Resistor 56 and capacitor 64 are for RF decoupling. Capacitor 72 is an RF bypass capacitor for RF step down transformer 70. RF collector voltage is stepped down in RF transformer 70 at point 74 and supplied to port No. 2 of coupler 22 via capacitor 76.

Negative feedback in the circuit 10 of FIG. 3 is achieved collector-to-base about RF amplifying transistor 54 by way of the coupler port No. 3 and decoupled port No. 4 which, in the preferred embodiment, is down 12db from port 2. Output power is delivered to load resistor 50 from the coupler 22 by way of port 1. The coupler through loss for a 12 or 14db coupling is less than 0.4db.

The input signal also goes through the coupler from port 3 where the decoupled power is delivered directly to the output load resistor 50. There is a 180° phase shift in transistor 54 and 0° phase shift between ports 2 and 4 of the coupler. This, therefore, creates the proper conditions for negative feedback. Power not delivered to the transistor is transferred into the decoupled output port No. 1.

The circuit of FIG. 3 yields gains of 12 to 14db from 5 to 600 megahertz, an input voltage standing wave ratio of less than 1.5:1, and noise figures of less than 2db. Performance is of course contingent on the type of transistor used for Q2. Other features may be desirable such as a broadband transformer on the base of transistor 54 for certain transistor devices to obtain best performance.

Transistor Q1 and resistors R1, R2, R3 and R4 form the biasing circuit for transistor Q2 so that no emitter resistor and bypass capacitor is required on Q2. This biasing arrangement is described in more detail in assignee's U.S. Pat. No. 3,805,164 in the name of Gary R. Callaway. Capacitors C1 and C4 are RF bypass capacitors and capacitors C2 and C3 are RF coupling capacitors.

Figure 4:
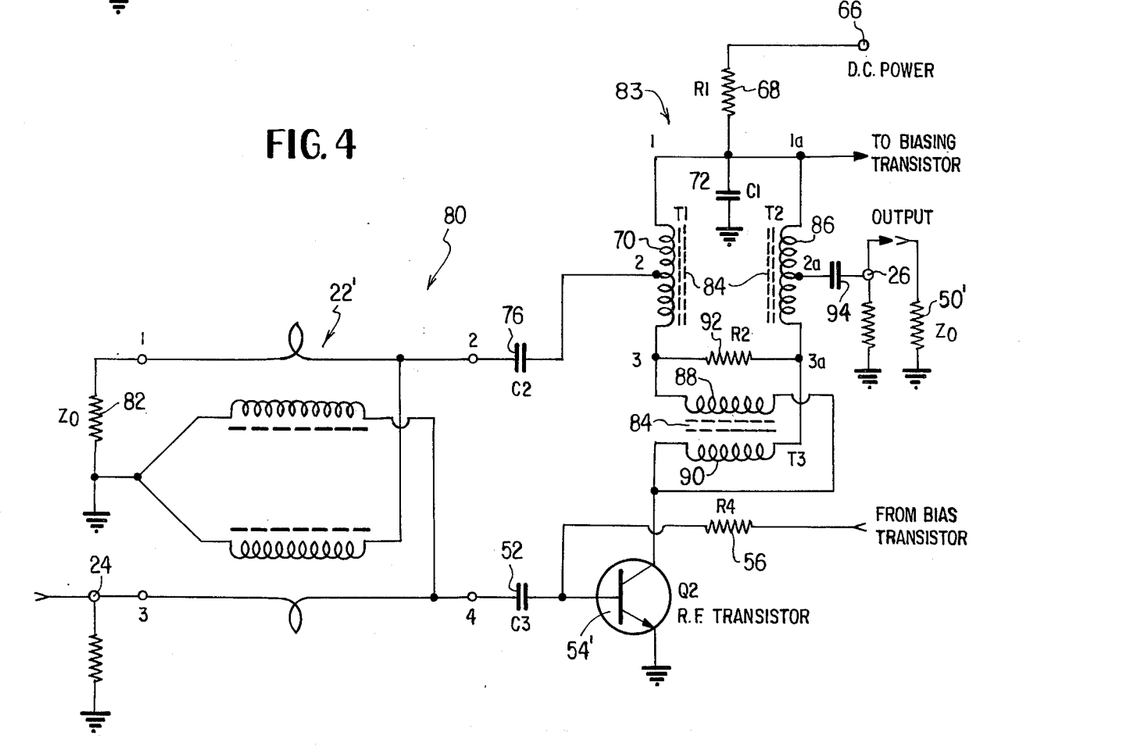
FIG. 4 is a circuit diagram of a modified broadband amplifier constructed in accordance with the present invention having improved input/output isolation.

FIG. 4 shows a modified embodiment of an amplifier constructed in accordance with the present invention, generally identified as amplifier 80. This amplifier incorporates a second broadband directional coupler in order to achieve good unilateral properties. Amplifier 80 again comprises the directional coupler 22 but in this case, port 1 of the directional coupler is terminated in a good fixed characteristic impedance $Z_0$ as indicated at 82. In FIG. 4, like parts bear like reference numerals and transistor 54 is connected to a bias circuit in all respects identical to the bias circuit of FIG. 3 including transistor 58. However, this bias circuit connected to resistor 56 in FIG. 4 has been omitted in that figure for the sake of clarity.

In FIG. 4, auto transformer 70 forms a part of a second broadband directional coupler generally indicated at 83 and again including a ferrite core as indicated by the dashed lines at 84. Broadband directional coupler 83 is in the form, in the preferred embodiment, of a 3db directional coupler splitter, and comprises additional windings 86 and 90 connected as illustrated. A resistor 92 having a resistance value of $4Z_0$ is connected across the 3-3A ports of splitter 82 and an output to a load impedance 50' is taken from a tap on winding 86 by way of coupling capacitor 94 labeled C4.

In the embodiment of FIG. 4, by splitting the output power between the output terminal 26 and the feedback to directional coupler 22 by means of splitter 83, the coupler 22 can be terminated at port 1 with the good fixed ($Z_0$) load 82. The 3db directional coupler 82 is an in-phase splitter. Transformer windings 70, 86, 88 and 90, along with resistor 92, form the basic 3db splitter and can all be wound on the same ferrite core, although they need not be. Windings 70 and 86 transform the characteristic impedance $Z_0$ of the system up to $2Z_0$. The transformer formed by windings 88 and 90 is a push-push bifilar transformer. If pins 3 and 3A of transformers T1 and T2 in FIG. 4 are at the same impedance of $2Z_0$, no voltage is dropped between these pins and transformer T3 formed by windings 88 and 90. However, any reflective signal from the output at pin 2A of transformer T2 appears at pin 3 of transformer of T1, 180° out of phase by way of transformer T3. Likewise, the signal appears in phase by way of resistor 92 and cancels or nulls at pin 3 of transformer T1. If the output impedance of transistor 54 is $Z_0$ as assumed, then the value of resistor 92 should be $4Z_0$ for best cancellation or hybrid isolation. If the transistor Q2 output impedance is different than the characteristic impedance $Z_0$ of the system, then the value of resistor 92 (R2) can be modified accordingly. The 3db coupler 83, with a ferrite core, has a bandwidth of from 5 to 900 megahertz. Because of the termination of directional coupler 22 in the good fixed characteristic impedance 82, the amplifier 80 of FIG. 4 displays excellent input/output isolation.

Figure 5:
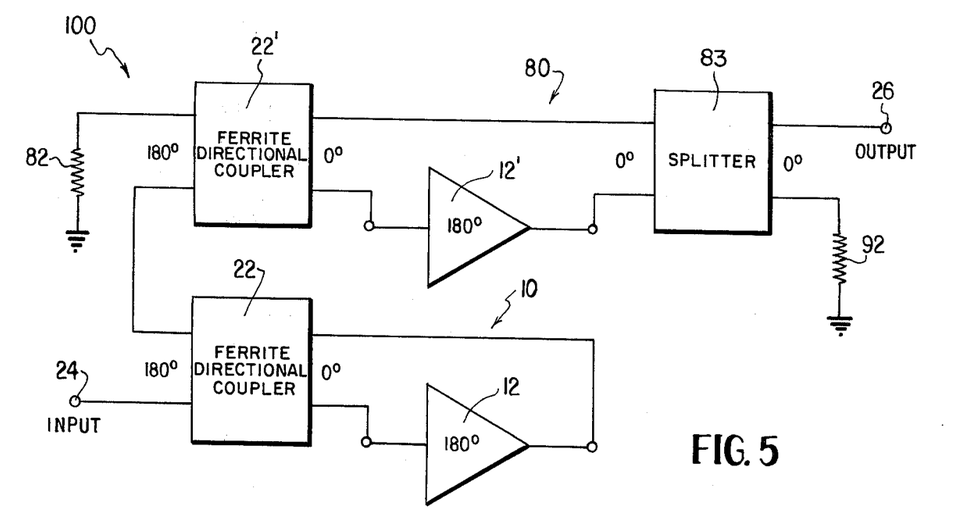
FIG. 5 is a circuit diagram of a two-stage broadband amplifier constructed in accordance with this invention.

FIG. 5 shows a further modified embodiment of the present invention generally indicated at 100. This embodiment is a two-stage device with the first stage comprising the amplifier 10 of FIGS. 1 and 3 and the second stage comprising the modified amplifier 80 of FIG. 4. The output of amplifier stage 10 in FIG. 5 is connected to the input of amplifier stage 80 by way of a lead 102. This circuit has all the desirable properties previously described including the excellent input/output isolation of the amplifier 80 and displays 22db of gain.

Figure 6:
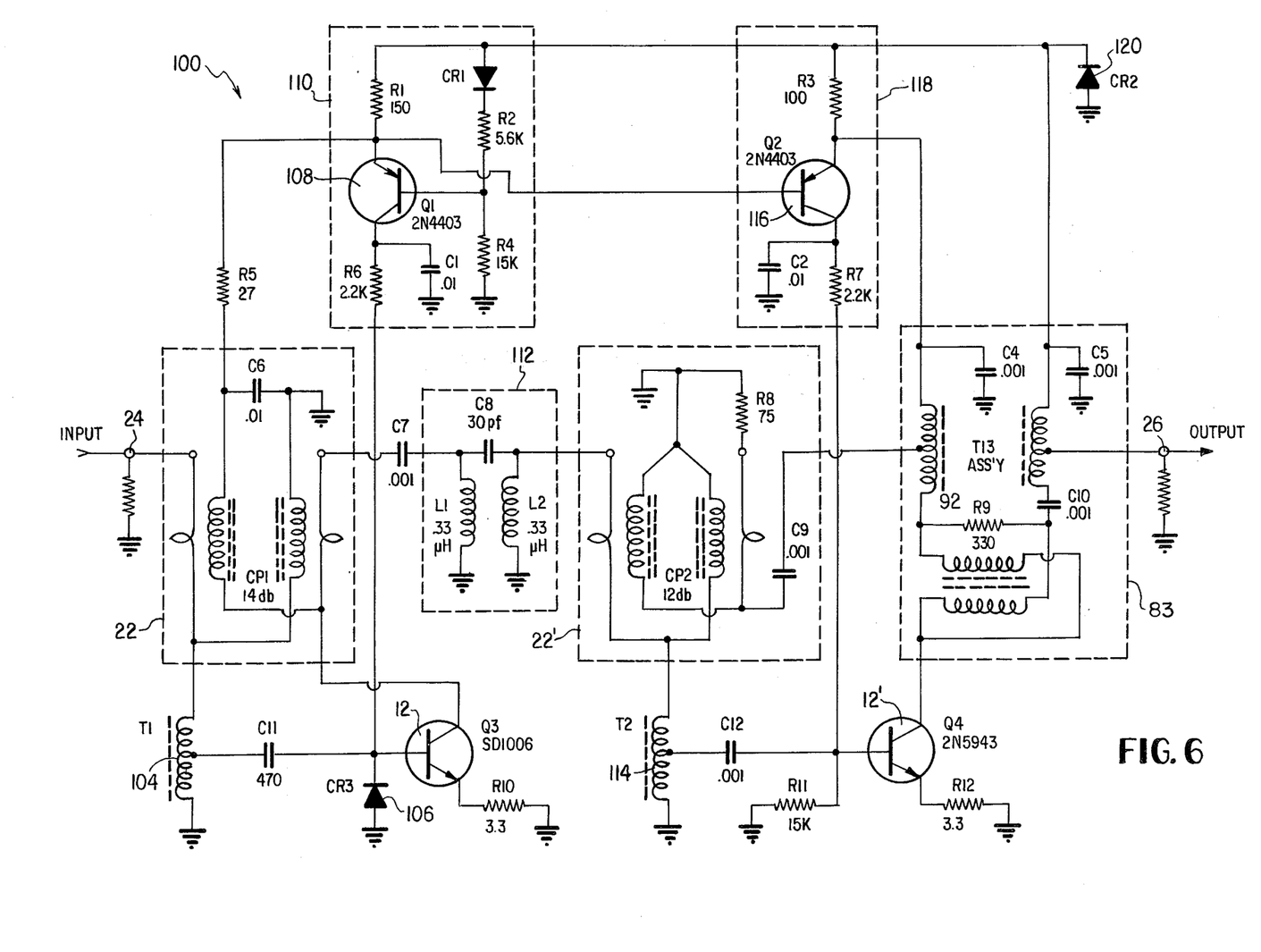
FIG. 6 is a detailed circuit diagram of the two-stage amplifier of FIG. 5.

FIG. 6 is a detailed circuit diagram of the two-stage broadband amplifier 100 shown in block form in FIG. 5. In FIG. 6, corresponding parts of the circuit are similarly labeled. An input signal is applied to the input jack 24 and this passes through the 14db directional coupler indicated by the dashed box 22. It is also supplied to a broadband matching transformer 104 coupled to the base of transistor amplifier 12 labeled Q3 in FIG. 6. Transformer 104 transforms the 75 ohm input impedance down to approximately the 37 ohm base impedance for the transistor and is a broadband impedance matching transformer. The diode 106 is also connected to the transistor base to provide for lightening protection (reverse protection). The overall gain of the first stage is 12db. Transistor bias is provided, as in the previous constructions, by the transistor 108 labeled Q1 and the overall first stage bias circuit is identified by the dashed box 110.

From the first stage, the signal passes through a high pass (42 megahertz) filter 112 which limits the low frequency response for preamplifier application. Without the high pass filter 112, the frequency response goes down to about 5 megahertz. The signal then passes through the second directional coupler indicated by the dashed box 22' which is shown as including the 75 ohm resistor 82 previously described and again the signal is applied to the base of the second stage amplifier 12' labeled Q4 through a broadband matching transformer 114 which is, in all respects, identical to the transformer 104 previously described.

In the preferred embodiment, coupler 22' for the second stage is a 12db coupler to produce an overall gain of 10db for the second stage. Second stage bias is provided by transistor 116 labeled Q2 and the overall bias circuit for the second stage is indicated by the dashed box 118. Diode 120 is a 27 volt zener diode for lightening protection and is rated for heavy surge current. Included in the second stage is the two-way in-phase splitter (coupler 83) which includes provision for routing DC to various points in the circuit. In the preferred embodiment, a 21 volt DC power supply is connected to the output jack 26 so that the jack both receives 21 volt DC and acts as an output port for the amplified RF. Reference may be had to assignee's U.S. Pat. No. 3,843,922, issued Nov. 22, 1974, for a detailed discussion of a power supply usable with the broadband amplifier of the present invention in preamplifier configuration.

In the circuit of FIG. 6, capacitors C1, C2, C4, C5 and C6 are RF bypass capacitors and capacitors C7, C9, C10, C11 and C12 are RF coupling capacitors. Resistors R10 and R12 provide for a small amount of emitter degeneration which improves impedance match and intermodulation performance without hurting the noise figure of the circuit. The overall gain for the circuit in FIG. 6 is 22db with a frequency regulation of ±0.5db over a frequency band of 54 to 220 megahertz. The circuit impedance is 75 ohms with a voltage standing wave ratio in/out of 1.3:1. A noise figure of 3.5db is typical.

Figure 7:
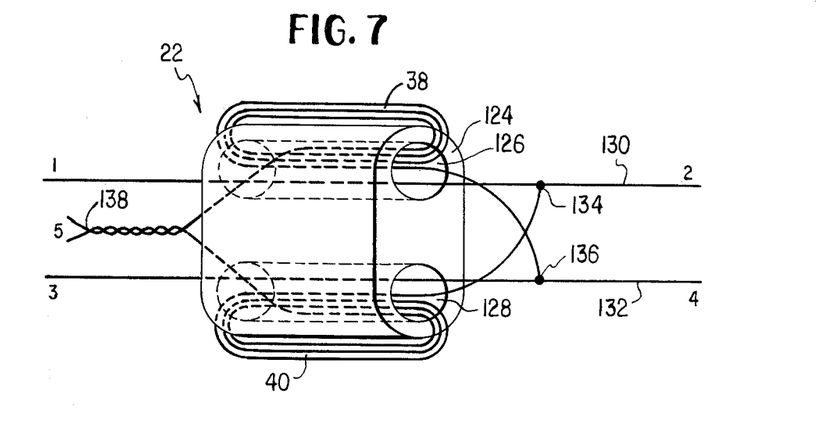
FIG. 7 is a perspective view showing the physical construction of the directional coupler of FIGS. 1 and 2.

FIG. 7 shows a typical physical construction for the ferrite directional coupler 22. The coupler comprises a body 124 having a pair of through apertures or circular bores 126 and 128 which are parallel to each other and through which pass electrical leads 130 and 132. These leads form the single turn windings 36 and 42 of FIG. 2 within the core, and the ports are labeled in FIG. 7 in accordance with the similar labeling in FIG. 2. The core 124 is preferably made of ferrite material having a $\mu$ of approximately 125. Coils 38 and 40 are looped through the apertures 124 and 128 and for a 12db coupler each has three turns; for a 14db coupler each has four turns. These are connected to the lines 130 and 132 as indicated at 134 and 136 at one end, and the other end of each coil 38 and 40 is twisted together and connected to a grounding pin as indicated at 138.

Figure 8:
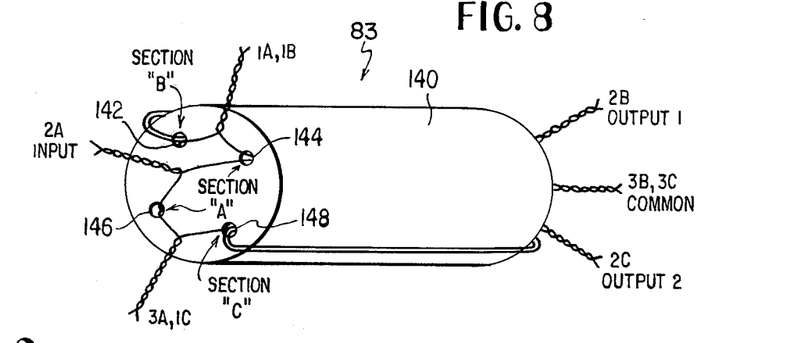
FIG. 8 is a perspective view showing the physical construction of the two-way splitter of FIG. 4.
Figure 9:
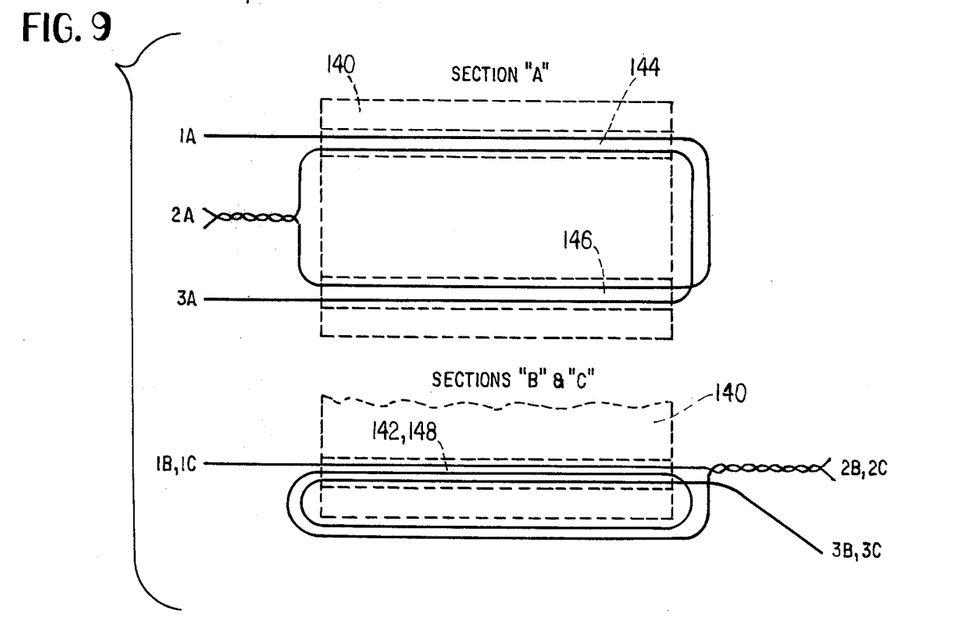
FIG. 9 shows the different winding arrangements for the different sections of the splitter of FIG. 8.
Figure 10:
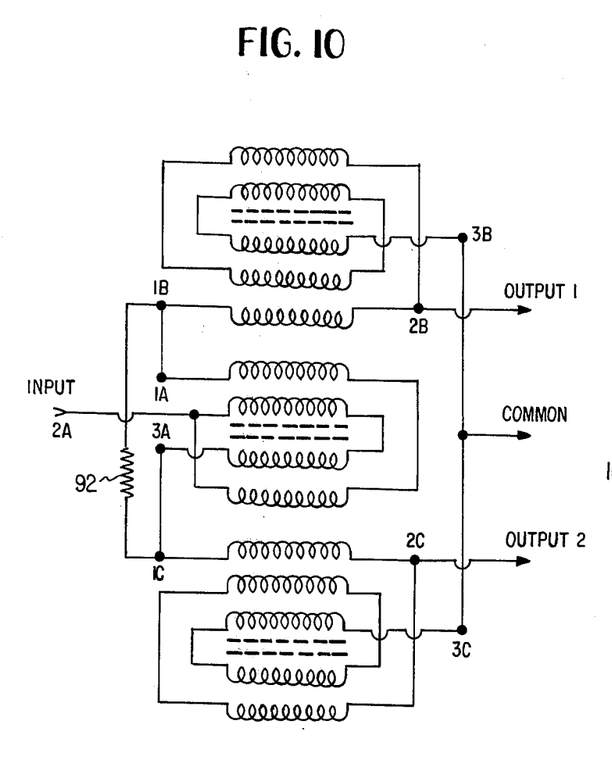
FIG. 10 shows a complete winding schematic for the splitter.

FIG. 8 shows a typical physical construction for the phase splitter 83 of FIGS. 4 and 6. It comprises a cylindrical ferrite core 140 through which completely pass four small cylindrical apertures 142, 144, 146 and 148. The core 140 is preferably formed from a ferrite material having a $\mu_0$ of approximately 250. FIG. 9 shows the winding detail for the splitter 83 and FIG. 10 is a schematic circuit diagram for the splitter. The splitter comprises three sections, namely a section A which is wound through the apertures 144 and 146; a section B which is wound through aperture 142 and the outside of the core; and a section C which is wound through aperture 148 and the outside of the core. Since sections B and C are of identical construction, only section B is illustrated in FIG. 9, it being understood that section C is similarly wound. It forms a two-way in-phase splitter with a flat bandwidth of from 5 to 900 megahertz.

Each of sections B and C are wound through one of the apertures of core 140 and around the outside of the core. Section B is wound through aperture 142 and section C is wound through aperture 148 in FIG. 8. Section A is wound through the two apertures 144 and 146 and does not pass over the outside edge of the core, as do sections B and C. Each of the sections is formed of two wires having the free ends 1A and 3A for section A and two intermediate ends twisted together to form the terminal 2A in FIG. 9. Similarly, sections B and C have three ends 1B, 1C, and 3B, 3C, and two intermediate ends twisted together as indicated at 2B and 2C in FIG. 9. In the final assembly, all the free ends are twisted together as illustrated in FIG. 8. The corresponding wiring diagram is illustrated in FIG. 10 with the respective ends A, B, C, of the three sections similarly labeled to show the electrical interconnections formed by the twists in FIG. 8. The electrical input is to terminal 2A, a first output from terminal 2B and a second output taken from terminal 2C. Terminals 3B and 3C are interconnected and form the common connection. Also shown in FIG. 10 is the connection of resistor 92 between terminals 1A and 1B and terminals 3A and 1C. This resistor has a value of approximately $4Z_0$, or about 300 ohms.

Figure 11:
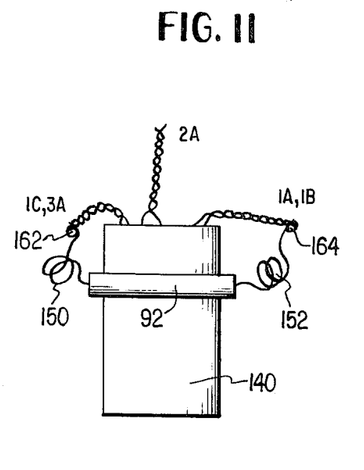
FIG. 11 is a partial plan view of the splitter showing the splitter resistor connection.
Figure 12:
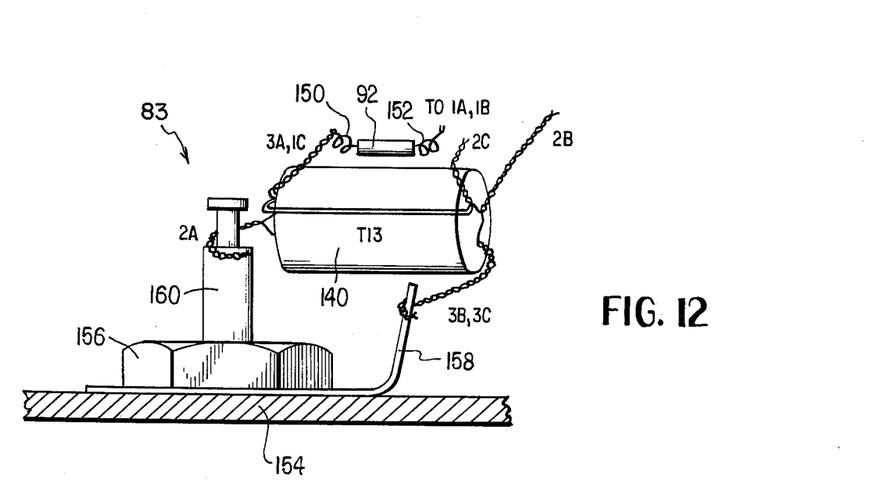
FIG. 12 shows a typical splitter mounting arrangement.

FIGS. 11 and 12 illustrate the manner of mounting resistor 92 to the splitter 83. The resistor is shown in FIG. 11 as above the core 140 and is connected through coils 150 and 152, each having 2½ turns to the respective terminals 3A, 1C, and 1A, 1B.

FIG. 12 shows the manner of mounting the splitter 82 to a support plate 154. Attached to the plate by a nut 156 is a ground lug 158 and an input terminal 160 suitably insulated from ground. The twisted pair comprising input terminal 2A is connected to terminal 160 and the twisted ends 3B, 3C are connected to the ground lug 158. Coils 150 and 152 are soldered as at 162 and 164 (FIG. 11) to respective twists 3A, 1C, and 1A, 1B. As previously indicated, the outputs are derived from twists 2B and 2C.

Figure 13:
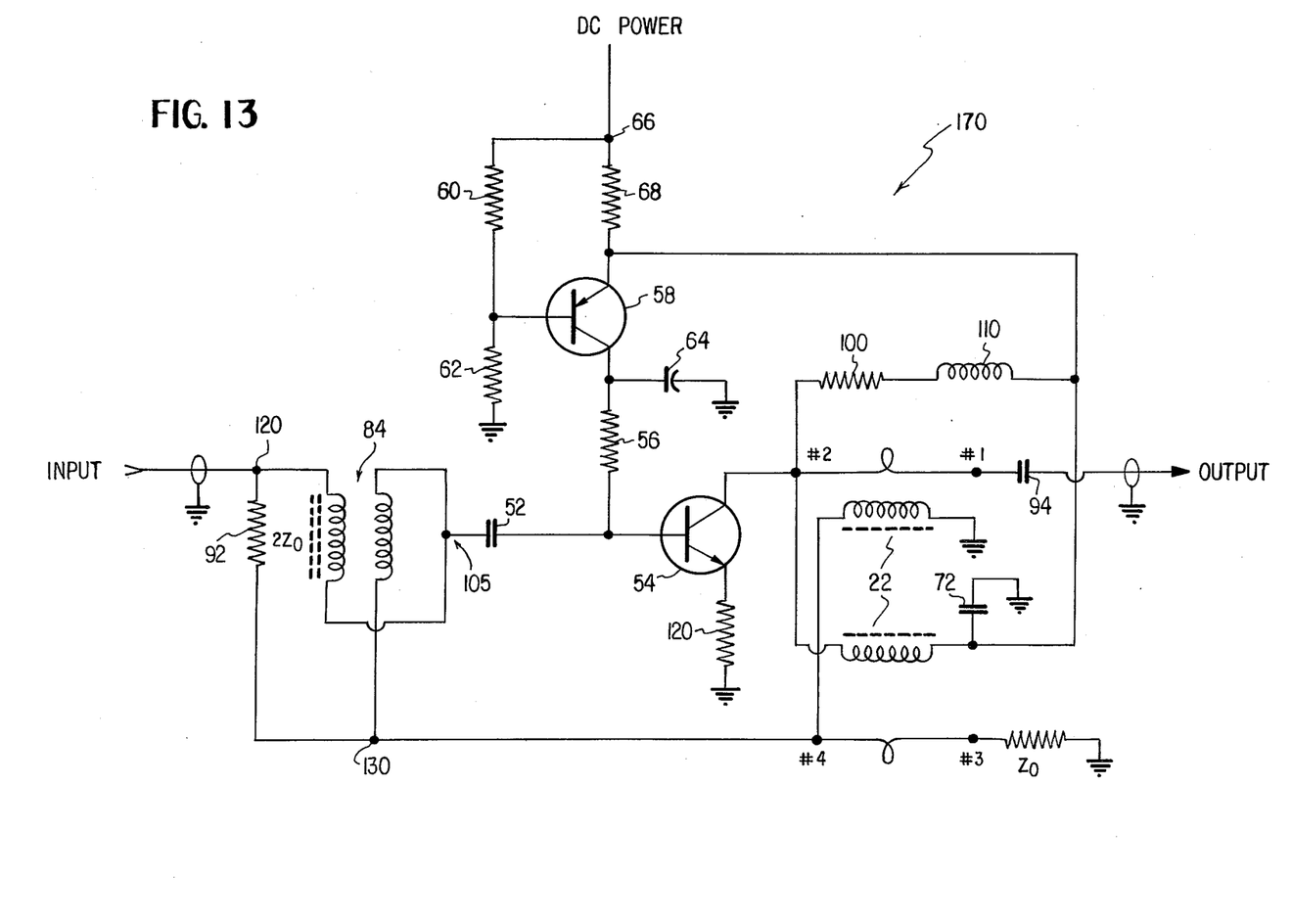
FIG. 13 shows a modified amplifier similar to that of FIG. 4 but with the splitter at the input.

Another configuration of the broadband amplifier using couplers is shown at 170 in FIG. 13, in which like parts bear like reference numerals. This amplifier uses the ferrite directional coupler at the amplifier output and the 3db in-phase splitter at the input. The main advantage of this configuration is that it allows higher output drive capabilities, fewer circuit components, and more gain bandwidth product. The latter is realizable because of the fewer impedance transformers needed with their additional losses and phase shift problems in the feedback loop.

Because of the 3db splitter at the input, a 3db degradation in noise figure results. However, a two-way splitter can be constructed using a push-push bifilar transformer 84 followed at junction 105 by a 2:1 impedance step-up transformer at the output. Thus, the junction impedance at 105 is $\frac{1}{2}Z_0$. In FIG. 13, the RF transistor 54 has a very low base input impedance at higher RF frequencies. Emitter resistor 120 is used and does lower the transistor gain somewhat but also increases the transistor input impedance. Resistor 120 values of a few ohms raises the base impedance to approximately $\frac{1}{2}Z_0$ at higher frequencies. This results in the proper impedance at junction 105 without a step-up transformer.

Output power from RF transistor 54 is supplied through directional coupler 22, port No. 2 to port No. 3 through capacitor 94 to the output. Feedback is achieved from decoupled 0° port No. 4 to input splitter 84 and junction 130.

Input power is delivered to input splitter junction 120. At lower RF frequencies, the transistor 54 input impedance is much higher than $\frac{1}{2}Z_0$. However, due to the higher transistor gain, the negative feedback through splitter transformer 84 and resistor 92 forces the input impedance at junction 120 to be maintained at $Z_0$ for minimum signal (cancellation) at junction 105. At higher frequencies and lower transistor gains, the transistor input approaches $\frac{1}{2}Z_0$, so a good input match is maintained over a wide RF bandwidth.

The same conditions are true with the output. Normal feedback lowers the output impedance to a very low value. However, by using directional couplers, maximum cancellation at port No. 4 occurs when port No. 2 sees a good $Z_0$ match. Thus, the feedback forces the transistor output to approach true $Z_0$. At higher frequency, the addition of resistor 100 and inductor 110 compensates for output transistor capacity and higher collector impedances when the closed loop gain lowers. The same matching features are true for the circuit of FIG. 4.

The invention may be embodied in other specific forms without departing from the spirit or essential characteristics thereof. The present embodiment is, therefore, to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. A broad band amplifier comprising an input terminal and an output terminal, an amplifying stage coupled between said input and output terminals, a first ferrite directional coupler coupled to the output of said amplifying stage, said first directional coupler having a first output coupled to said output terminal and a second output, and a second ferrite directional coupler coupling said second output of said first directional coupler to the input of said amplifying stage, one of said directional couplers comprising a broad band 0° to 180° coupler, said second directional coupler applying said second output of said first coupler to the input of said amplifying stage as RF negative feedback whereby both said ferrite directional couplers are in the negative feedback loop of said amplifying stage.

2. An amplifier according to claim 1 wherein said first directional coupler comprises an in-phase splitter.

3. An amplifier according to claim 1 wherein said first coupler is a 3db coupler.

4. An amplifier according to claim 1 wherein said second coupler is a 12db coupler.

5. An amplifier according to claim 1 wherein said second directional coupler comprises an in-phase splitter.

6. An amplifier according to claim 1 wherein said second coupler is a 3db coupler.

7. An amplifier according to claim 1 wherein said first coupler is a 12db coupler.

8. A broad band amplifier comprising an input terminal and an output terminal, an amplifying stage coupled between said input and output terminals, a first directional coupler coupled to the output of said amplifying stage, said first directional coupler having a first output coupled to said output terminal and a second output, a second directional coupler coupling said second output to the input of said amplifying stage, and an additional amplifying stage coupled to said input terminal, said additional amplifying stage having a third directional coupler between its input and output for negatively feeding back a portion of its output to its input.

9. An amplifier according to claim 8 wherein both said amplifying stages exhibit a 180° phase shift between input and output.

* * * * *